US009523785B2

United States Patent
Denham et al.

(10) Patent No.: US 9,523,785 B2
(45) Date of Patent: Dec. 20, 2016

(54) METHOD FOR DETERMINING GEOLOGICAL SURFACE AND SUBSURFACE RESISTIVITY

(71) Applicant: Dynamic Measurement, LLC, Cedar City, UT (US)

(72) Inventors: L. R. Denham, Houston, TX (US); H. Roice Nelson, Jr., Cedar City, UT (US); D. James Siebert, Katy, TX (US)

(73) Assignee: Dynamic Measurement, LLC, Cedar City, UT (US)

( * ) Notice: Subject to any disclaimer, the term of this patent is extended or adjusted under 35 U.S.C. 154(b) by 247 days.

(21) Appl. No.: 14/451,074

(22) Filed: Aug. 4, 2014

(65) Prior Publication Data

US 2016/0033672 A1    Feb. 4, 2016

(51) Int. Cl.
| | |
|---|---|
| *G01V 3/00* | (2006.01) |
| *G01V 3/02* | (2006.01) |
| *G01R 29/08* | (2006.01) |
| *G01R 31/02* | (2006.01) |
| *G01R 31/26* | (2014.01) |

(52) U.S. Cl.
CPC ............. *G01V 3/02* (2013.01); *G01R 29/0814* (2013.01); *G01R 29/0842* (2013.01); *G01R 31/2642* (2013.01)

(58) Field of Classification Search
CPC .......... G01V 3/00; E21B 49/005; E21B 49/08; G01N 33/2823; G01R 29/0814; G01R 29/0842; G01R 31/2642
USPC .................................................. 324/323–375
See application file for complete search history.

(56) References Cited

U.S. PATENT DOCUMENTS

| | | | |
|---|---|---|---|
| 5,295,071 A | 3/1994 | Kuzma et al. | |
| 8,344,721 B2 | 1/2013 | Nelson, Jr. et al. | |
| 2003/0151398 A1* | 8/2003 | Murphy ............. | G01R 29/0842 324/72 |
| 2008/0091354 A1* | 4/2008 | Byerly .................... | G01V 3/082 702/6 |
| 2009/0234583 A1* | 9/2009 | Dwyer .................... | G01W 1/16 702/4 |
| 2009/0281730 A1* | 11/2009 | Said ........................ | G01W 1/16 702/4 |
| 2011/0163733 A1 | 7/2011 | Nelson, Jr. et al. | |
| 2011/0267027 A1 | 11/2011 | Annotti et al. | |

FOREIGN PATENT DOCUMENTS

| | | |
|---|---|---|
| CN | 103245826 | 8/2013 |
| WO | WO2009/121160 | 10/2009 |
| WO | PCT US2015/043484 | 8/2015 |

\* cited by examiner

*Primary Examiner* — Son Le
*Assistant Examiner* — Raul Rios Russo
(74) *Attorney, Agent, or Firm* — Portland Intellectual Property, LLC

(57) ABSTRACT

A method for determining geological subsurface resistivity. The method includes obtaining a set of lightning parameters associated with a lighting strike received by a geological volume of material, the set of lightning parameters including an indicium of the current of the lightning strike at a first initial time and an indicium of the current of the lightning strike at a first decay time subsequent to the first initial time, and inferring the resistance of the volume of geological material, at least in part, from the set of lightning parameters.

6 Claims, 2 Drawing Sheets

METHOD FOR DETERMINING GEOLOGICAL SURFACE AND SUBSURFACE RESISTIVITY

FIELD OF INVENTION

The present invention relates to methods for determining the earth's subsurface resistance to the flow of electrical current, which is useful for identifying subsurface geological features such as porosity, pore fluid, and matrix properties, as well as man-made features.

BACKGROUND

Subsurface resistivity studies are often used to obtain information about subsurface geology, being considered inexpensive, fast, and non-invasive. Such studies are based on Ohm's law relating voltage (V), current (I), and electrical resistance (R) as V=IR. That is, for a given volume of material, a voltage applied across that material will result in a current flow through that material in proportion to its electrical resistance (or more generally, its electrical impedance).

Resistivity, typically denoted by the Greek letter "ρ," is a material constant that is related to electrical resistance. It is more particularly a normalized form of electrical resistance that takes account of the cross-sectional area (A) of the volume—the current flowing perpendicular to this area, and the resistance decreasing in direct proportion to this area—, and the length (L) of the volume—the current flowing parallel to this length, and the resistance increasing in direct proportion to this length (ρ=RA/L).

Subsurface resistivity is typically measured by staking four electrodes into the earth, spaced apart from each other, using a current source to force a known current to flow through the earth between two of the electrodes, and measuring the voltage difference across the other two electrodes. The value of V/I is proportional to the resistivity (V/I=ρ L/A), and the constant of proportionality (L/A) is determined by a complex computerized calculation.

While such resistivity studies are relatively inexpensive and fast compared to known alternatives, they still require visiting the site and using specialized equipment to make measurements. And while thought of as being non-invasive, such resistivity studies do require staking electrodes into the ground. Accordingly, there is a need for a method for determining geological subsurface resistivity that further reduces cost and increases speed by eliminating the need to visit the site or disturb the surface.

SUMMARY

A method for determining geological subsurface resistivity. The method is based on determining the electrical resistance of a geological volume of material that has received a first lightning strike, including obtaining a first set of lightning parameters, the first set of lightning parameters including an indicium of the current of the first lightning strike at a first initial time and an indicium of the current of the first lightning strike at a first decay time subsequent to the first initial time, and making a first inference of the resistance, at least in part, from the first set of lightning parameters.

The first inference may be normalized so as to make it proportional to the current of the first lightning strike at the first initial time.

Where the geological volume has received a second lightning strike, the method may further include obtaining a second set of lightning parameters, the second set of lightning parameters including an indicium of the current of the second lightning strike at a second initial time and an indicium of the current of the second lightning strike at a second decay time subsequent to the second initial time, and making a second inference of the resistance, in part, from the second set of lightning parameters.

The first inference may be normalized so as to make it proportional to the current of the first lightning strike at the first initial time, and the second inference may be normalized so as to make it proportional to the current of the second lightning strike at the second initial time.

The first and second inferences may be averaged. The average may be determined after normalizing the first inference so as to make the first inference proportional to the current of the first lightning strike at the first initial time, and normalizing the second inference so as to make the second inference proportional to the current of the second lightning strike at the second initial time.

It is to be understood that this summary is provided as a means of generally determining what follows in the drawings and detailed description and is not intended to limit the scope of the invention. Objects, features and advantages of the invention will be readily understood upon consideration of the following detailed description taken in conjunction with the accompanying drawings.

DETAILED DESCRIPTION OF PREFERRED EMBODIMENTS

The present invention resulted from the inventor's recognition that geological subsurface resistivity ought to be related to lightning data, and determination of that relationship. Heretofore, lightning had been considered a purely meteorological phenomenon.

Figure 1:
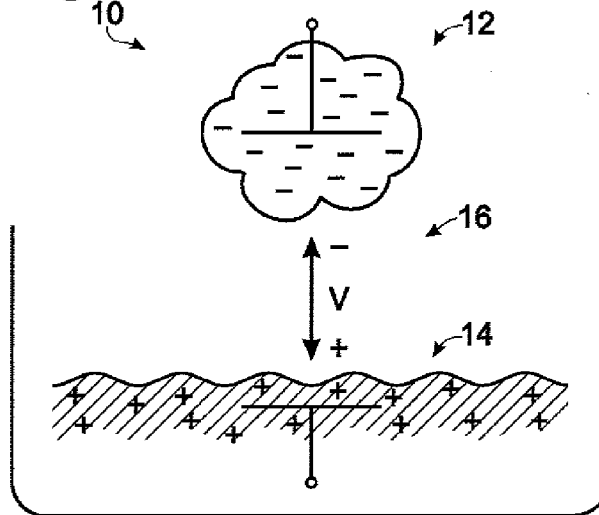
FIG. 1 is a pictorial representation of the conditions precedent to a lightning strike.

FIG. 1 illustrates a natural system 10 that forms a lightning strike. A cloud 12 develops a negative charge relative to the (earth) ground 14 underneath, which correspondingly develops a positive charge, the difference in charge defining a voltage "V" between the cloud and the ground. No current flows between the earth and the cloud as the voltage V increases, until the voltage becomes high enough to ionize the atmosphere 16 between the cloud and the ground.

Figure 2:
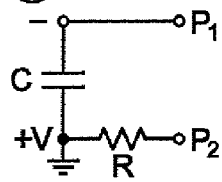
FIG. 2 is a schematic of an electrical circuit modeling the conditions of FIG. 1.

FIG. 2 illustrates a circuit approximation of the lightning system 10 according to the invention. The capacitor C (having capacitance C) stores the charges in the cloud and the ground shown in FIG. 1, and the resistor R (having resistance R) represents geological subsurface resistance.

Figure 3:
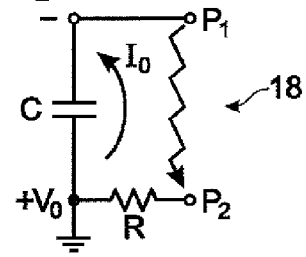
FIG. 3 is a schematic of the electrical circuit of FIG. 2 at the time of initiation of a lightning strike.

FIG. 3 shows the circuit of FIG. 2 as soon as the voltage V has reached the atmospheric ionization voltage, referred to herein as $V_o$. At that instant ($t_o$), a lightning strike 18 discharges through the atmosphere 16 into the ground, corresponding to an initial current $I_o$ flowing out of the capacitor, jumping the gap between point "$P_1$" and point "$P_2$," and passing through the resistance R.

Figure 4:
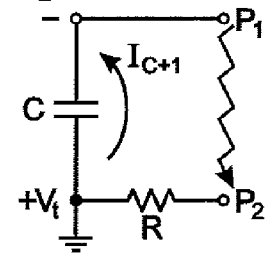
FIG. 4 is a schematic of the electrical circuit of FIG. 3 at times subsequent to the time of initiation of the lightning strike.

FIG. 4 shows the circuit of FIG. 3 at later times (t), with voltage $V_t$ and current $I_t$.

This circuit approximation can be used to relate the geological subsurface resistance R, which can be related to resistivity ρ, to the current in a lightning strike.

In an electrical circuit in which the voltage across a capacitor discharges through a series resistance R, the voltage decays exponentially with a time constant RC:

$$V_t = V_o e^{-t/RC} \qquad \text{Equation (1)}$$

Since $V_t = RI_t$, and assuming R is a constant:

$$I_t = I_o e^{-t/RC} \qquad \text{Equation (2)}$$

$I_o$ is the peak current of the lightning strike, which is a measured and recorded parameter for lightning strikes around the world, made available to the public. For example, Vaisala owns and operates the "National Lightning Detection Network" in the U.S., and operates the Canadian Lightning Detection Network, which together provide a comprehensive historic lightning database for lightning strikes in the United States and Canada. Another reported lightning parameter is known as the "peak-to-zero" time.

The circuit approximation provides a means for relating the geological subsurface resistance R, which can in turn be related to resistivity ρ, to lightning parameters as follows.

Taking the natural logarithm of both sides of Equation (2) provides a first expression for R, i.e., $$\ln(I_t) = \ln(I_0) - t/RC; \text{ and so} \qquad \text{Equation (3)}$$

$$R = \frac{t}{C[\ln(I_0) - \ln(I_t)]}$$

Also, $$C = \in A/d \qquad \text{Equation (4)}$$

where "∈" is the dielectric constant of air (≈8.854×10⁻¹² farads/m); "d" is the distance between the plates of the capacitor C, corresponding to the distance between the cloud and the ground; and "A" is the effective area of the plates of the capacitor that are used to model the cloud and the ground. It is recognized that the area "A" can be approximated by a circle of diameter "d," so that $A = \pi d^2$. Then, $$C = \in \pi d, \qquad \text{Equation (5)}$$

and Equation (3) becomes:

$$R = \frac{t}{\in \pi d[\ln(I_0) - \ln(I_t)]} \qquad \text{Equation (6)}$$

Now note that $V_o = V_{BD} d$, where $V_{BD}$ is the breakdown voltage of the atmosphere 16, which is approximately 3.0 MV/m. Since $V_o = I_0 R$, then $$R = \frac{V_{BD} d}{I_0} \qquad \text{Equation (7)}$$

Equating the two expressions for "R" (Equations (6) and (7)) yields:

$$\frac{V_{BD} d}{I_0} = \frac{t}{\in \pi d[\ln(I_0) - \ln(I_t)]} \qquad \text{Equation (8)}$$

Or, $$d^2 = \frac{tI_0}{V_{BD} \in \pi [\ln(I_0) - \ln(I_t)]}$$

And from Equation (7):

$$R^2 = \frac{tV_{BD}}{I_0 \in \pi [\ln(I_0) - \ln(I_t)]} \qquad \text{Equation (9)}$$

Equation (9) solves for the resistance R in terms of how the lightning current in a particular lightning strike 18 changes over time. In particular, recall from Equation (3) that:

$$\frac{t}{[\ln(I_0) - \ln(I_t)]} = RC$$

The quantity $\{t/[\ln(I_o) - \ln(I_t)]\}$ is constant; therefore "t" can be a time corresponding to any desired current $I_t$. It is beneficial to choose a time "t" for which measured lightning current parameters exist, particularly that time known as the "peak-to-zero" time, because this is a reported lightning parameter.

Corresponding to the "peak-to-zero" time is the current at this time, which may be referred to as the "zero" current with the understanding that the current is never identically zero but only approaches zero asymptotically according to Equation (3).

The "zero" current is not a reported lightning parameter, but the "peak-to-zero" time is necessarily the time at which the current reaches "zero" current. So in order to measure and specify a "peak-to-zero" time, it is necessary to measure and specify "zero" current. Hence, for any given peak current, the corresponding "zero" current is a known or determinable parameter.

In the lightning detection networks, lightning strikes are detected at multiple detection stations that triangulate the detected signals to determine the strike locations, and thereby to estimate the magnitudes of the strikes based on the magnitudes of the detected signals, falling off as the reciprocal of the square of the distance. At any particular lightning detection station, the strike may be far enough away that the signal never rises above the background noise and is therefore not detectable. At the other extreme, the strike is close enough to the lightning detection station that the signal is above the background noise and is therefore detectable all the way from its peak value to its "zero" value. Between the extremes, a strike may be close enough to the detection station for the peak current to be detectable, and for some time thereafter as the current decays, but not after it has decayed so much that it reaches "zero."

It is assumed herein that if a "peak-to-zero" time is recorded for a lightning strike, the corresponding "zero" current was either actually detected or was estimated from the detected rate of decay. It is also assumed that the "zero" current is a fixed percentage of the peak current (equivalently a certain number of time constants of the exponential rate of decay), so that meaningful comparisons of the "peak-to-zero" time for one lightning strike with the same time for another lightning strike can be made. That is, it is assumed that "zero" current=$KI_o$, where K is a fixed value which is (significantly) less than 1.0.

One conservative way to establish the level of "zero" current reported by a lightning detection network would be, in view of all the lightning strikes for which "peak-to-zero" data are reported, to define the "zero" current as being the smallest value of current that remains detectable above the background noise at all the detection stations used for reporting the data. That would ensure that an actual "zero" current was actually detected and measured to establish the "peak-to-zero" time for every reported lightning strike. An estimate of the "zero" current using this rationale is to take the "zero" current as being half the smallest of the reported peak currents.

Figure 5:
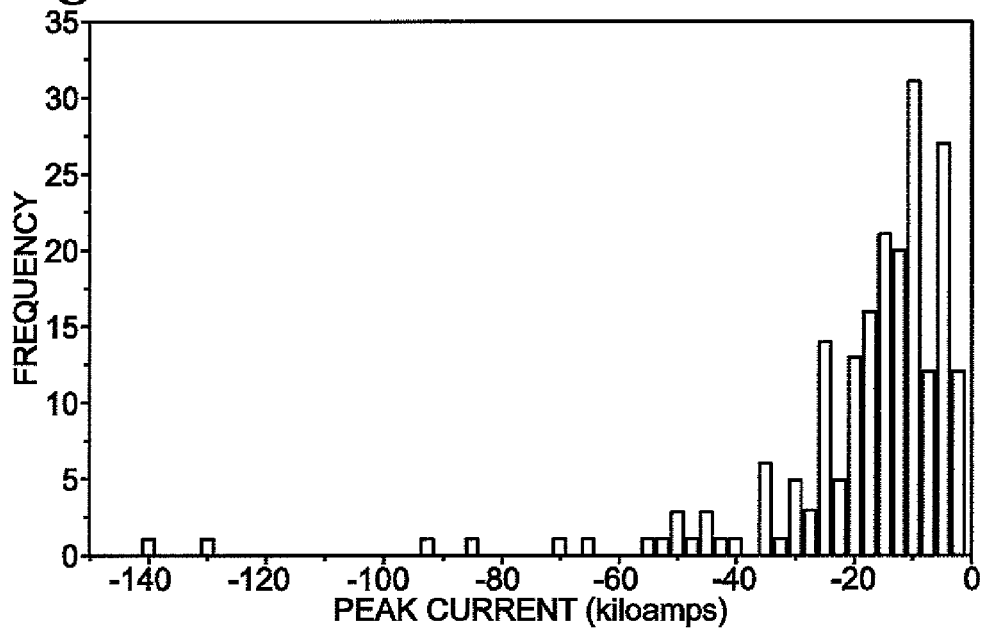
FIG. 5 is a histogram of reported values of peak lightning current for a number of lightning strikes in a test area.

FIG. 5 shows a histogram of reported values of peak current for 204 lightning strikes in a test area of about 32,000 m$^2$ (measurements taken from the year 2000 through 2011). The largest peak current is 140 kiloamps and the smallest peak current is about 1 kiloamp. Taking half of this latter value as "zero" current, Equation (9) can be solved for each of these lighting strikes.

Figure 6:
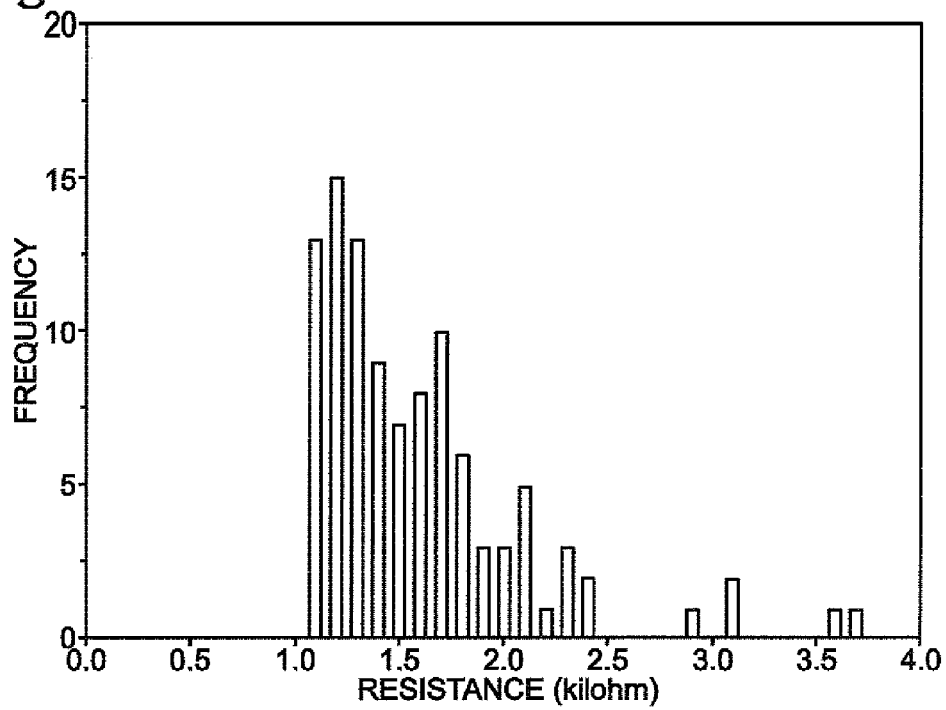
FIG. 6 is a histogram of resistance values computed according to the present invention for lightning strikes represented in FIG. 5.

FIG. 6 shows the computed resistance values, which, discarding obvious outliers, can be seen to fall broadly within a range 1.0 and 2.5 kilohms, with the significant majority of the values falling more narrowly between about 1.3+/−0.3 kilohms. Thus it is apparent that a usefully precise measure of ground resistance R in the test area can be obtained by use of Equation (9).

Figure 7:
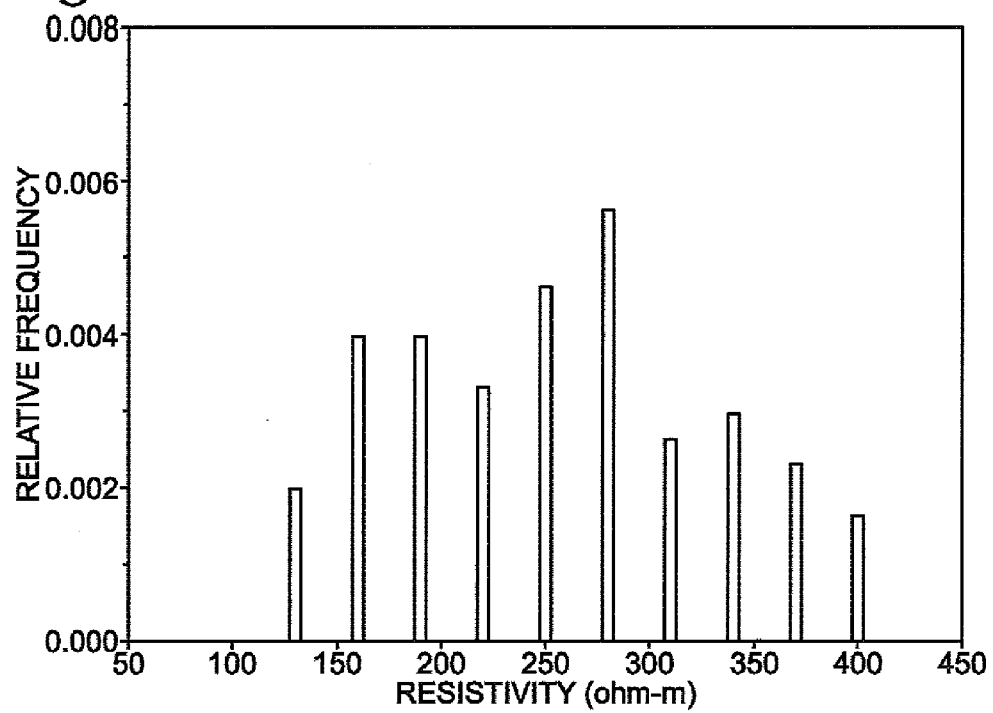
FIG. 7 is a histogram of resistivity values computed according to the present invention for the lightning strikes represented in FIG. 6.

Resistivity ρ is related to resistance R as ρ=RA/L. Here, A/L defines the geometry of the volume of earth ("VOE") into which the lightning current flows, and specifies a size of the VOE in linear dimensions (e.g., meters). As an approximation, the charged area of the earth is a circle with a radius proportional to the elevation of the cloud 12 (FIG. 1), and the depth of penetration of the current is proportional to the radius of this circle. Thus the area of the volume of earth through which the current flows is proportional to the square of the elevation of the cloud, and the length of the volume of earth through which the current flows is proportional to the elevation of the cloud. Taking the elevation of the cloud as an unknown constant, FIG. 7 shows a histogram of resistivity for the R values shown in FIG. 6 based on this approximation.

It should be recognized that, while Equation (9) relates R to peak current $I_o$, it is not essential to use peak current in the computation. It can be observed from Equations (2) and (3) more generally that:

$$R = \frac{t}{C[\ln(I(t=t_1)) - \ln(I(t=t_2))]}, \text{ for any values of } t_2 > t_1.$$

It follows that an equivalent to Equation (9) can be obtained and used to solve for R for any two values of current, together with the corresponding times, or equivalently, a first current at an initial time $t_1$, and the rate of decay of the current which establishes the current at any subsequent time $t_2$.

Computations according to the principles described herein are preferably performed on a computer; either a general purpose digital computer or computer system suitably programmed to perform such computations, such as a PC or Macintosh, or a special purpose computer suitably hardwired, or a combination of the two. Data for the computations may be downloaded from the lightning databases over a local area network, or over a wide area network such as the Internet, or they may be provided to the computer or computer system in computer readable media, such as hard disks and CD-ROMs.

It is to be understood that, while a specific method for determining geological subsurface resistivity has been shown and described as preferred, other methods in accordance with the principles described herein could be utilized without departing from the principles of the invention.

The terms and expressions which have been employed in the foregoing specification are used therein as terms of description and not of limitation, and there is no intention in the use of such terms and expressions to exclude equivalents of the features shown and described or portions thereof, it being recognized that the scope of the invention is defined and limited only by the claims which follow.

The invention claimed is:

1. A method for determining the electrical resistance of a geological volume of material that has received a first lightning strike, comprising obtaining a first set of lightning parameters including an indicium of the current of the first lightning strike at a first initial time and an indicium of the current of the first lightning strike at a first decay time subsequent to the first initial time, and making a first inference of the resistance, at least in part, by employing the first set of lightning parameters in a circuit approximation of a natural system in which a cloud develops a negative charge relative to the earth defining a voltage therebetween, the natural system including an atmosphere between the cloud and the earth in which no current flows until the voltage becomes high enough to produce a lightning strike, the circuit comprising first, second, and third nodes representing, respectively, the cloud, a surface of the geological volume of material that receives the lightning strike, and an earth ground, a capacitor coupled between the first and second nodes representing electrical charge storage in the cloud and the earth, and a resistor coupled between the second and third nodes representing said resistance.

2. The method of claim 1, wherein the geological volume has received a second lightning strike, further comprising obtaining a second set of lightning parameters including an indicium of the current of the second lightning strike at a second initial time and an indicium of the current of the second lightning strike at a second decay time subsequent to the second initial time, and making a second inference of the resistance, in part, from employing the second set of lightning parameters in the circuit approximation.

3. The method of claim 2, further comprising obtaining an average of the first and second inferences.

4. The method of claim 3, wherein the average is determined after normalizing the first inference so as to make the first inference proportional to the current of the first lightning strike at the first initial time, and normalizing the second inference so as to make the second inference proportional to the current of the second lightning strike at the second initial time.

5. The method of claim 2, further comprising normalizing the first inference so as to make the first inference proportional to the current of the first lightning strike at the first initial time, and normalizing the second inference so as to make the second inference proportional to the current of the second lightning strike at the second initial time.

6. The method of claim 1, further comprising normalizing the first inference so as to make the first inference proportional to the current of the first lightning strike at the first initial time.

* * * * *